United States Patent
Mayer et al.

(10) Patent No.: US 7,211,175 B1
(45) Date of Patent: May 1, 2007

(54) METHOD AND APPARATUS FOR POTENTIAL CONTROLLED ELECTROPLATING OF FINE PATTERNS ON SEMICONDUCTOR WAFERS

(75) Inventors: Steven T. Mayer, Clackamas, OR (US); Jonathan Reid, Sherwood, OR (US); Robert Contolini, Clackamas, OR (US)

(73) Assignee: Novellus Systems, Inc., San Jose, CA (US)

( * ) Notice: Subject to any disclaimer, the term of this patent is extended or adjusted under 35 U.S.C. 154(b) by 231 days.

(21) Appl. No.: 10/365,577

(22) Filed: Feb. 11, 2003

Related U.S. Application Data

(60) Continuation of application No. 09/854,230, filed on May 10, 2001, now Pat. No. 6,562,204, which is a division of application No. 09/515,414, filed on Feb. 29, 2000, now abandoned.

(51) Int. Cl.
*C25B 15/02* (2006.01)
*C25D 17/00* (2006.01)
(52) U.S. Cl. .................. 204/228.1; 204/242; 204/279; 204/286.1; 204/229.1; 204/229.8; 204/230.1; 204/224 M; 204/224 R; 205/83; 205/123; 205/640; 205/641; 205/643; 205/644
(58) Field of Classification Search ............. 204/229.9, 204/242, 229.8, 435, 416, 228.1, 229.1, 230.1, 204/224 M, 224 R, 279, 286.1; 205/96, 205/103, 123, 83, 641, 643–644
See application file for complete search history.

(56) References Cited

U.S. PATENT DOCUMENTS

| | | | |
|---|---|---|---|
| 3,959,088 A | | 5/1976 | Sullivan |
| 4,100,036 A | * | 7/1978 | Rode et al. .................... 205/83 |
| 4,869,971 A | | 9/1989 | Nee et al. |
| 5,096,550 A | * | 3/1992 | Mayer et al. ................ 204/212 |
| 5,419,826 A | * | 5/1995 | Zirino ......................... 204/416 |
| 5,421,987 A | * | 6/1995 | Tzanavaras et al. ......... 204/212 |
| 5,470,453 A | * | 11/1995 | Nipkow et al. ............. 204/435 |
| 5,578,167 A | * | 11/1996 | Sooriakumar et al. ....... 438/745 |
| 5,871,630 A | | 2/1999 | Bhattacharya et al. |
| 5,935,762 A | | 8/1999 | Dai et al. .................... 430/312 |

(Continued)

OTHER PUBLICATIONS

Skoog et al. Fundamentals of Analytical Chemistry, 7th Edition, 1996, pp. 412-415.*

(Continued)

*Primary Examiner*—Roy King
*Assistant Examiner*—Lois Zheng
(74) *Attorney, Agent, or Firm*—Parsons Hsue & de Runtz LLP

(57) ABSTRACT

Controlled-potential electroplating provides an effective method of electroplating metals onto the surfaces of high aspect ratio recessed features of integrated circuit devices. Methods are provided to mitigate corrosion of a metal seed layer on recessed features due to contact of the seed layer with an electrolyte solution. The potential can also be controlled to provide conformal plating over the seed layer and bottom-up filling of the recessed features. For each of these processes, a constant cathodic voltage, pulsed cathodic voltage, or ramped cathodic voltage can be used. An apparatus for controlled-potential electroplating includes a reference electrode placed near the surface to be plated and at least one cathode sense lead to measure the potential at points on the circumference of the integrated circuit structure.

8 Claims, 2 Drawing Sheets

U.S. PATENT DOCUMENTS

| | | | |
|---|---|---|---|
| 5,936,707 A | 8/1999 | Nguyen et al. | 355/18 |
| 5,939,788 A | 8/1999 | McTeer | 257/751 |
| 5,972,192 A | 10/1999 | Dubin et al. | 205/101 |
| 6,004,440 A * | 12/1999 | Hanson et al. | 204/279 |
| 6,022,465 A * | 2/2000 | Ting et al. | 205/118 |
| 6,071,399 A | 6/2000 | Vander Bergen et al. | 205/337 |
| 6,156,167 A * | 12/2000 | Patton et al. | 204/270 |
| 6,203,684 B1 | 3/2001 | Taylor et al. | |
| 6,261,433 B1 * | 7/2001 | Landau | 205/96 |
| 6,365,033 B1 * | 4/2002 | Graham et al. | 205/775 |
| 6,562,204 B1 * | 5/2003 | Mayer et al. | 204/229.9 |
| 2002/0029962 A1 * | 3/2002 | Stevens et al. | 204/224 R |

OTHER PUBLICATIONS

Ives, *Reference Electrodes, Activity Coefficients*, Chapter 4, pp. 107-123 (1961).

*ULSI Technology*, Eds. C.Y. Chang and S.M. Sze, McGraw Hill, pp. 444-445 (1966).

* cited by examiner

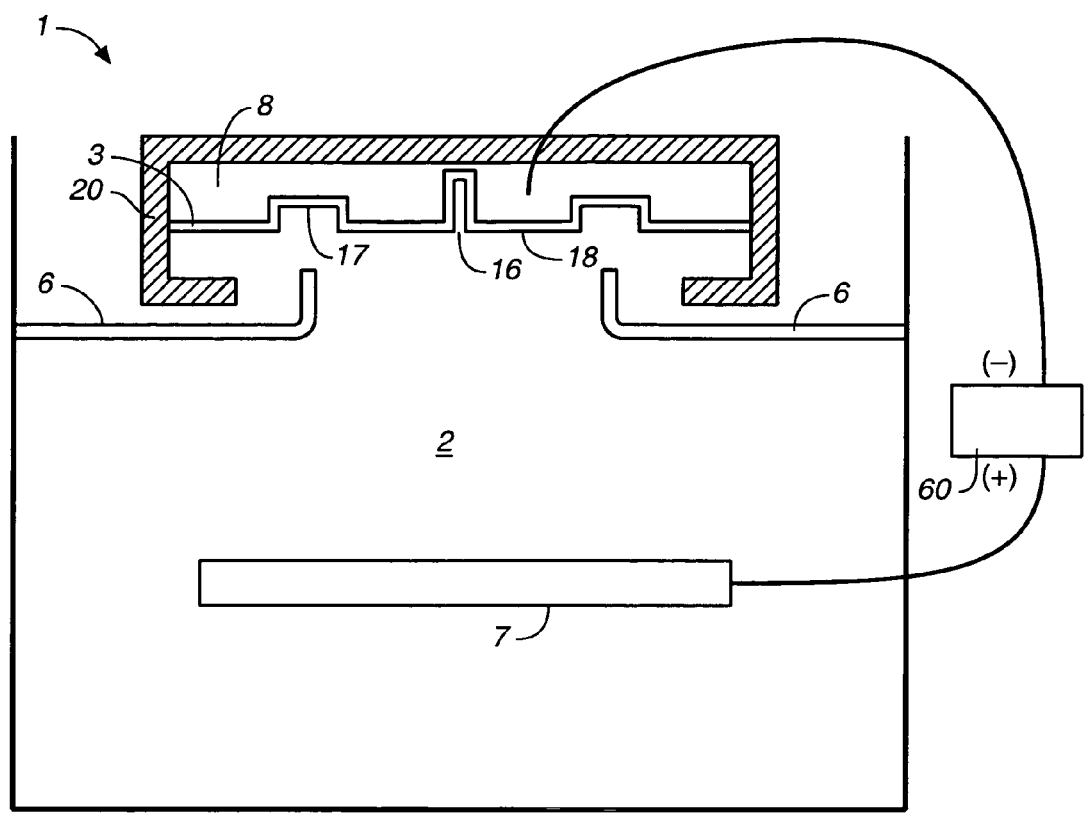
FIG._1

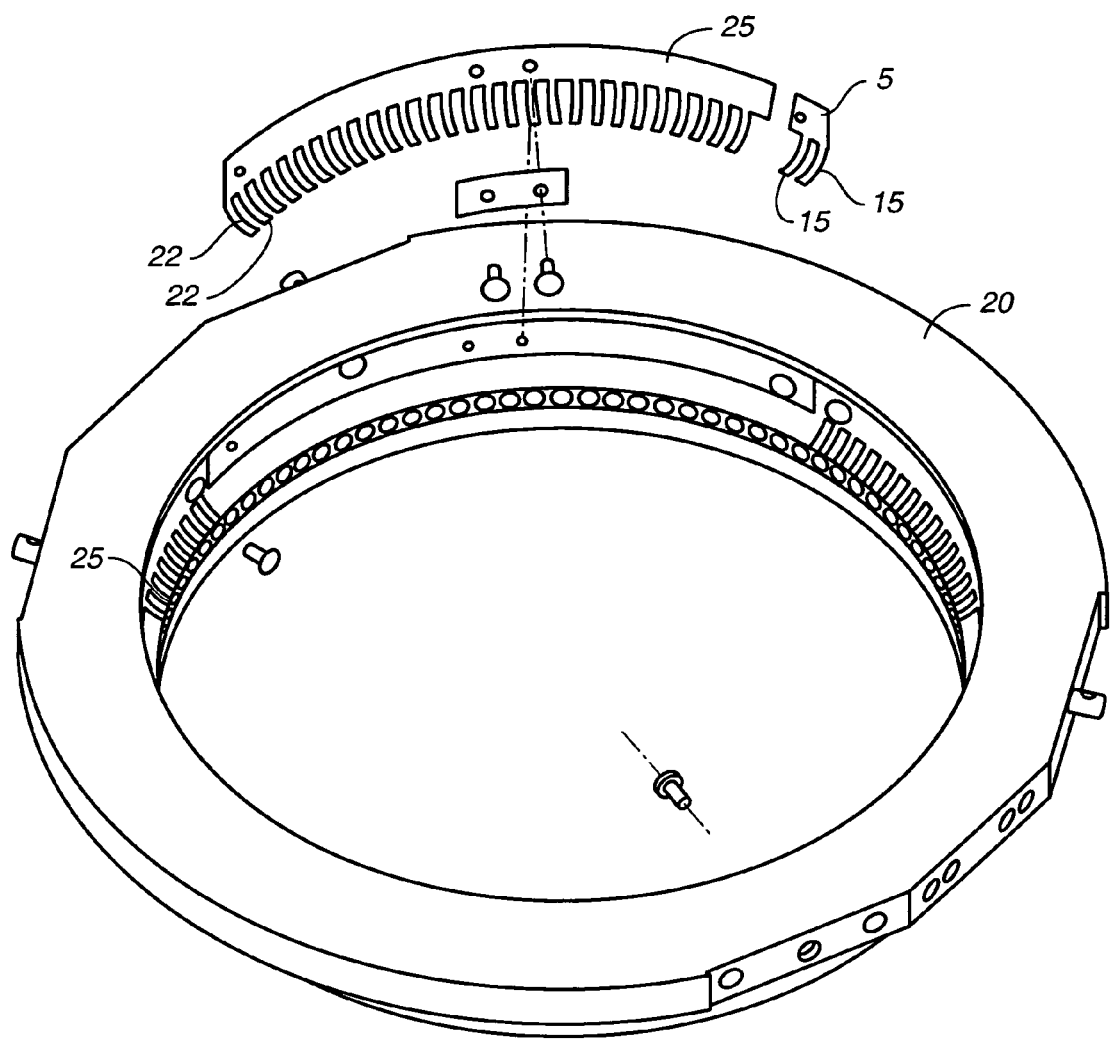
FIG._2

METHOD AND APPARATUS FOR POTENTIAL CONTROLLED ELECTROPLATING OF FINE PATTERNS ON SEMICONDUCTOR WAFERS

CROSS-REFERENCE TO RELATED APPLICATIONS

This application is a continuation of U.S. patent application Ser. No. 09/854,230, filed May 10, 2001 now U.S. Pat. No. 6,562,204, which in turn is a divisional of U.S. patent application Ser. No.09/515,414, filed Feb. 29, 2000, now abandoned, which is also the parent of U.S. Application No. 09/853,959, filed on May 10, 2001, now U.S. Pat. No. 6,551,483.

BACKGROUND OF THE INVENTION

1. Technical Field

This invention relates generally to electroplating methods and apparatus and, in particular, to processes and apparatus for potential-controlled electrodeposition of metal into small integrated circuit features such as vias and trenches.

2. Description of Related Art

Conductive interconnections on integrated circuits typically take the form of trenches and vias. In modern submicron integrated circuits, trenches and vias are typically formed by a "damascene" or "dual damascene" process as described, for example, in the reference *ULSI Technology*, Eds. C. Y. Chang and S. M. Sze (McGraw-Hill, 1996, pp. 444–445). In damascene processing, an interlayer dielectric (typically $SiO_2$) is deposited atop a planarized layer containing, for example, a metal via. The top dielectric layer is patterned and etched, typically using conventional photolithographic procedures. Metal is then deposited into features and on the flat field region atop the features, typically first by CVD, PVD and then by electrodeposition. The metal layer is typically planarized resulting in the desired metallic pattern. Dual damascene processing is similar but makes use of two patterning and etching steps and typically fills features with metal spanning more than one layer in a single metallization step. A more complete description of damascene and dual damascene processing is found in the cited reference.

As the art moves towards integrated circuits having reduced feature sizes, it becomes increasingly difficult to form electrically conductive metallizations such as vias, contacts and conductors. Techniques for forming such metallizations include physical vapor deposition (PVD), chemical vapor deposition (CVD), plasma enhanced chemical vapor deposition (PECVD) and electrochemical deposition (also referred to as electroplating or electrodeposition) of metals such as copper. Electroplating is particularly well suited for the formation of small embedded damascene feature metallization due to the ability to readily control the growth of the electroplated film for bottom-up filling without voids, and due to the superior electrical conductivity characteristics of the electroplated film. However, there are also several obstacles which need to be overcome to fully realize these advantages.

One challenge facing damascene and dual damascene processing techniques is the difficulty of initiating the growth of the metal film within recessed features without forming voids or seams. In typical PVD and some CVD processes, metal may preferentially deposit near the top of recessed features leading to a "bottleneck" shape. Further plating of metal onto the bottleneck may result in sealing the top of the feature before completely filling the feature with metal, creating a void. Voids increase the resistance of the conductor over its designed value due to the absence of planned-for conductor. Also, trapped electrolyte in sealed voids may corrode the metal. This may lead to degraded device performance or device failure in extreme cases.

The problem of electroplating metal into integrated circuit features without the formation of voids or seams is the subject of previously filed U.S. patent application No. 09/410,170 (herinafter, "prior application"). The prior application is commonly assigned with the present application; is the parent of divisional application, U.S. Patent application No. 09/716,016 (hering after, "divisional application"), now U.S. Pat. No. 6,946,065; and is incorporated herein by reference. The content of the prior application may be found in U.S. Pat. No. 6,946,065 that is associated with the divisional application. The prior application identified previously unrecognized problems with conventional electroplating techniques and described a four-step approach to overcome them or to mitigate their deleterious effects on the electroplating processes. The four phases relate to the following: 1) the entry of the wafer into the electroplating bath, including procedures to reduce or eliminate corrosion of thin metal seed layers already deposited on the surfaces of recessed features ("entry phase"); 2) the conformal growth of metal seed layers having sufficient thickness to support delivery of current to the bottom of the feature and permit subsequent bottom-up feature filling ("initiation phase"); 3) preferential deposition of metal onto the bottom of high aspect ratio ("AR") features (having AR's greater than about 0.5) leading to bottom-up filling and the reduction of the ARs; and 4) rapid filling of low AR features in a rapid substantially conformal manner until the required metal thickness is achieved.

The methods described in the prior application relate generally to constant current ("galvanostatic") or controlled current ("galvanodynamic") processes. Thus, the current was the parameter controlled and the voltage was understood to take on whatever value necessary to achieve the specified current. Use of galvanostatic or galvanodynamic processes has the advantage of requiring typically simpler and less expensive power sources than those typically required in the practice of controlled-voltage ("potentiodynamic") processes.

Prior art and literature pertaining to potentiostatic and potentiodynamic electroplating is limited in comparison with the literature and prior art related to galvanostatic and galvanodynamic electroplating. Controlled-potential electroplating is typically a more complicated process than controlled current electroplating for several reasons. 1) Controlled-current power supplies are more readily available at lower cost while only a limited number of (typically) more expensive power supplies are available for controlled-potential service. 2) A "four wire" system is typically required in controlled-potential electroplating in order to compensate adequately for potential drop in current-carrying wires and for contact resistances. For applications requiring excellent metal thickness uniformity, such as the integrated circuit fabrication processes described here, a reference electrode probe is advisable.

The present invention describes several advantages to be obtained with the use of controlled-potential electroplating processes for small recessed features in integrated circuit devices. Equipment fully to take advantage of potentiodynamic electroplating processes for the four-step filling of integrated circuit features with metal is also described.

SUMMARY OF THE INVENTION

Controlled-potential electroplating provides an effective method of electroplating metals onto the surfaces of high aspect ratio recessed features of integrated circuit devices. The rate of electroplating is strongly dependent on current density which is correlated with the applied voltage. Thus controlled-potential methods provide tighter control of the electroplating process than controlled-current methods. In addition, controlled-potential electroplating methods are more universally applicable, from wafer to wafer, essentially independent of the number, size, and distribution of recessed features on the wafer, than are controlled-current methods.

Controlling the potential during electroplating provides a process to mitigate corrosion of a metal seed layer on recessed features in a layer of an integrated circuit structure. The corrosion is due to contact of the seed layer with an electrolyte solution during the entry phase. The potential can also be controlled to provide conformal plating over the seed layer during the initiation phase and bottom-up filling of the recessed features during the third, bottom-up filling phase. At each phase, a constant cathodic voltage, pulsed cathodic voltage, or ramped cathodic voltage can be used.

An apparatus for controlled-potential electroplating includes a reference electrode placed near the surface to be plated and at least one cathode sense lead to measure the potential at points on the circumference of the integrated circuit structure.

BRIEF DESCRIPTION OF THE DRAWINGS

All drawings are schematic and not to scale. In the figures, similar reference numbers are used to identify similar elements FIG. 1 is a schematic diagram of an electroplating apparatus in which embodiments of the present invention are practiced.

FIG. 2 is a top view of the clamshell of the electroplating apparatus.

DETAILED DESCRIPTION

The present invention is directed towards the controlled-potential ("potentiodynamic") plating of metals onto the surfaces of high aspect ratio ("AR") features as would typically be encountered in the fabrication of integrated circuits. "Aspect Ratio" of a feature is defined as the ratio of the feature's depth to its width, in which width is determined in the plane of the wafer. For a trench, the width refers to the smaller dimension in the plane of the wafer. For a via, width is the feature diameter or side length in the plane of the wafer.

Accurate Measurement of Wafer Potential

It is relatively simple to measure and control the voltage (potential) across the electroplating cell; that is, the voltage between a working electrode (cathode) and a counter electrode (anode). However, attempting to use a voltage value determined at the counter electrode to control the electroplating process is subject to considerable uncertainty. Interpreting the voltage as measured at the counter electrode is complicated by the potential drop across the counter electrode caused by surface kinetics and diffusion (concentration) potential drops across the anode/electrolyte interface. Such potential drops can be complicated functions of current, hydrodynamic effects, counter electrode size, shape, age, etc. as well as on the processing history and the time during the electroplating process at which the voltage at the counter electrode is measured. Therefore, using a polarized electrode such as the counter electrode for controlling the potential in a potentiodynamic electrodeposition process is a difficult task in practice.

FIG. 1 is a schematic depiction of a typical apparatus for potentiodynamic electroplating according to one embodiment of the present invention. FIG. 1 depicts a "four wire" electroplating system as typically employed in the practice of the present invention. An electroplating system 1 contains a electrolyte solution or bath 2 as well as a wafer 8 to be electroplated. As described in the prior application, typical electrolyte baths contain ions of the metal to be plated and additives that may be plating suppressors, such as large molecules, or accelerator additives that adsorb onto surfaces and can increase the electroplating current locally (microscopically) in the presence of suppressors. As described below, the details of the initial contact between the wafer 8 and the electrolyte solution 2 is a probable source of damage to the metal seed layer previously deposited on the wafer and a complicating factor in electroplating high AR features.

FIG. 1 depicts wafer 8 as a multilayer structure. Surface 3 denotes the metal seed layer previously deposited onto wafer 8 by PVD or other means. Wafer 8 may be comprised of several layers of semiconductor, dielectric and other metallic layers underlying seed layer 3. Wafer 8 is depicted with features of varying aspect ratio, such as feature 16 with a large AR and feature 17 with a small AR. Field region 18 is the flat part of the surface of wafer 8 between features. The specific structure of the wafer 8 in layers below the seed layer 3 is not an important characteristic in the practice of the present invention except as such layers affect the feature structure of layer 3 or may be themselves exposed to the electrolyte solution.

Wafer 8 is held in the electroplating bath by a wafer-sealing "clamshell," 20, shown in greater detail in FIG. 2. Clamshell 20 includes contact fingers 22, which are electrically connected to an external power supply 60 (connection not shown). Contact fingers 22 are typically grouped in quadrants 25. For example, for electroplating a 200 mm wafer, 128 contact fingers may be grouped in four quadrants of 32 contact fingers, each. When wafer 8 is inserted in clamshell 20 from above, contact fingers 22 contact the edge of the wafer, which turns wafer 8 into the working electrode. Electroplating of metals involves the deposition of metallic cations from the electrolyte solution. The working electrode is thus a cathode and a first wire of the "four wire system."

Also depicted on FIG. 2 is cathode sense lead 5 that does not carry any appreciable current. The function of cathode sense lead 5 is to sense the voltage at one or more points directly on wafer 8 rather than rely on voltage determined at the power supply as is conventionally done in potentiodynamic electroplating. Cathode sense lead 5 comprises another of the "wires" of the four wire system. The use of such a lead making direct contact with the surface of the wafer 8 is important in making accurate potential measurements. The cathode sense lead 5 is not subject to appreciable voltage drop between the contact point on the surface of the wafer and the control measurement point of an operational amplifier which is responsible for the control of the potential in the present potentiodynamic electroplating system.

As shown in FIG. 2, the cathode sense leads can be incorporated into the clamshell design, for example, into the Novellus Systems Sabre™ and Sabre XT™ apparatus as a modification thereof. In the particular depiction in FIG. 2, cathode sense lead 5 includes two separated, electrically isolated fingers 15 contacting the wafer circumference. The contact fingers span from about 5° to about 10° around the circumference of wafer 8. From 1 to 4 contact "fingers" may be used. Additional cathode sense leads can be added, placed preferably at 90° or 180° from the primary cathode sense lead. These secondary cathode sense leads can be used to measure any non-uniformity of potential in the wafer surface as well as breaks occurring in wafers as they are loaded into the clam shell.

The counter electrode (anode) is depicted as 7 in FIG. 1 and may be considered another wire of the four wire system. In the electroplating of metals, anode 7 is typically a source of metal cations to replenish the cations of electrolyte solution 2 as they are deposited onto surface 3. Anode 7 may be a copper metal electrode for the electrodeposition of Cu. Alternatively, anode 7 is a dimensionally stable metal anode such as a platinum or titanium anode, as known in the art.

The electroplating apparatus also includes a reference electrode 6, which is used to monitor and control the potential of the wafer. The reference electrode measures the potential of the electrolyte solution with respect to the surface of the wafer 3. The potential measured by the reference electrode 6 differs from the potential measured by cathode sense lead 5 due to the charge-transfer potential drop across the surface of wafer 8 and the ohmic drop in solution between the wafer surface and the probe location due to diffusion overpotentials (concentration effects). Reference electrode 6 is preferably positioned in the electrolyte between the wafer and the counter electrode and as close as practical to the working electrode (wafer).

A reference electrode is preferably a probe electrode carrying essentially no current. That is, a reference electrode is connected to a high impedance circuit and is, itself, unpolarized. Several different reference electrodes meet these criteria and are useful in the practice of the present invention. A few examples are $Hg/Hg_2Cl_2$ (calomel), $Ag/AgCl$, $Hg/HgSO_4$, or a copper metal electrode ($Cu/Cu^{+2}$ couple). A copper metal electrode in a separate chamber filled with electrolyte offers several advantages as the reference electrode in the electroplating of copper, an important procedure in damascene and dual damascene processes. Among these advantages are the five now itemized. 1) A copper metal reference electrode will not be contaminated by the diffusion of $Cu^{+2}$ ions from the electroplating solution into the reference electrode chamber. 2) A copper metal reference electrode will not contaminate the bath by diffusion of ions from the reference electrode chamber into the electrodeposition bath (as would be the case for the Ag/AgCl reference electrode, for example, changing the Cl⁻ concentration in the electrodeposition bath). 3) A copper metal reference is more electrically stable than electrodes having liquid junctions due to the absence of the formation of a liquid junction potential. 4) A copper reference electrode simplifies the process control in the electrodeposition of copper as such an electrode always has a potential of 0 volts with respect to the working electrode. 5) A copper metal reference electrode is easy to maintain and inexpensive. The criteria for selection of reference electrodes are described, for example, in John S. Newman, *Electrochemical Systems*, (Prentice-Hall, Inc., Englewood Cliffs, N.J., 1973) pgs. 107–123.

For the electrodeposition of copper, the reference electrode is preferably a copper metal electrode contained in a capillary chamber flooded with electrolyte. Reference electrode 6 in FIG. 1 consists of a capillary chamber containing a metal electrode. The electrolyte in the reference electrode chamber contains the same metal ions as the electrolyte in the electrodeposition bath but does not contain accelerator or suppressor additives. It is also advantageous in the practice of the present invention that the chamber containing the copper electrode be separated from the plating chamber by insulating walls made of plastic or glass or other material resistant to the electroplating solution, or by diffusion barriers such as porous glass fritted material. It is also found favorable in the practice of the present invention that the capillary chamber containing the copper metal electrode have its opening near the wafer and terminating in close proximity to the wafer.

A plurality of reference electrodes may be utilized, preferably having capillary outlets in the electroplating solution at various positions near the wafer. These multiple reference electrodes can be used to monitor the potential in the electroplating solution at various points in proximity to the wafer surface and can be used in a feedback manner. Thus, they can provide important information in controlling the electrodeposition process to achieve and maintain plating uniformity from the center of the wafer to its edges. Multiple reference electrodes can also be useful in designing appropriate shielding or in dynamically modifying the shape of shielding members during the plating process. Dynamic shielding is described, for example, in the U.S. Pat. No. 6,402,923 of Mayer et al., issued on Jun. 11, 2002, entitled "Method and Apparatus for Uniform Electroplating of Integrated Circuits Using a Variable Field Shaping Element," which is commonly assigned with the present application and incorporated herein by reference.

Potentiodynamic Electroplating

In accordance with the present invention, a method of electroplating is presented which is particularly well suited for electroplating small features having high AR. Additionally, embodiments of the present invention relate to processes of electroplating a substrate having features with various ARs in a manner efficiently producing good quality coating for all such features.

The present invention typically includes four distinct phases designed to reduce or eliminate one or more problems commonly associated with conventional electroplating of recessed features.

An initial PVD deposition typically results in thin metal seed layers on the walls and bottoms of trenches and vias. As an example, electroplating of copper onto a tantalum (Ta) and/or tantalum nitride (TaN) barrier layer on a wafer is described here. However, the procedures and methods described are applicable to other plating processes, as apparent to those of ordinary skill in the art.

In addition to being thin, the morphology of the seed layer coating on walls/bottoms of trenches/vias can be non-uniform, consisting of isolated islands of copper lying on an underlying layer of tantalum (or other material). If exposed to oxygen or water, a tantalum oxide layer may form. The inventors have observed that placing a substrate having such islands into an electrolyte plating bath generally exacerbates wall/bottom non-uniformity, likely due to spontaneous electrochemical etching. Thus, the first phase, referred to as "the entry phase," includes procedures to reduce or avoid etching and corrosion of the copper seed layers within the features and thereby maintain the integrity of the seed layer for subsequent phases.

As the first, entry, phase avoids exacerbating the wall/bottom non-uniformity, the second or "initiation phase" repairs the surviving non-uniformity in the recessed features and thickens the metallic seed layer. The initiation phase includes nucleation and growth resulting in island-bridging of the seed layer non-uniformity within the features. During the initiation phase, the seed layer within the features is overlaid with another layer that is more uniform and provides sufficient electrical conductivity to the walls and bottoms of features to allow the selective bottom-up filling procedures of the subsequent phase (phase 3) to be carried out.

The features next must be filled with conductive material in such a manner as to reduce or eliminate the formation of seams and/or voids. It is found that features having ARs typically in excess of 0.5 ("high AR") require different electroplating conditions from those having low ARs (less than approximately 0.5) in order to achieve electroplating with seam/void reduction (or elimination). It is useful to describe the present invention in terms of the different conditions required for filling high and low AR features as two separate phases. However, as high AR features fill according to the desired bottom-up manner, the features' AR decreases. In actual practice, the electroplating conditions can be changed in a continuous manner to achieve filling of first high then low AR features. However, to make the discussion more definite, we consider the filling of high AR features separate from filling of low AR features.

The filling of high AR features, according to the present invention, referred to as "the bottom-up electrofilling phase," involves the deposition of electrically conductive material preferentially onto the bottoms of the high AR features. The formation of seams and voids is reduced or avoided for features of all sizes and ARs in this phase. The fourth phase, referred to as "the low AR feature filling phase," involves the electroplating of electrically conductive material into low AR features, typically with an AR less than 0.5.

1. The Entry Phase

During the initial or "entry phase" of the electroplating process for ULSI wafers, the existing metallic seed layer within small features is subject to corrosion reactions, crystal redistribution and, in general, removal of seed material from the bottom regions of trenches and vias. Either current or voltage can be fixed at a set value during this phase at a sufficiently low value to reduce the tendency for corrosion and dissolution of the seed layer.

If the current is fixed while the wafer is introduced into the electroplating solution, some portion of the wafer (for example, the center) will become wet with electrolyte solution prior to other portions of the wafer surface. The wetted portion of the wafer is the only region on the surface of the wafer subject to a complete electrical circuit. Thus, the amount of wafer surface area initially connected to the circuit is initially significantly less than that of the total wafer since the entire wafer surface does not become wetted instantaneously. Under conditions of controlled current, the wetted region will see a much higher current density than the portion of the wafer that becomes wet somewhat later. The difference in current density can cause a difference in feature filling rates at different parts of the wafer, e.g. too high a current can result in voids. In contrast, if the voltage is fixed to a given value during the entry phase, the current supplied to the wafer will slowly increase as the fraction of the wafer that is wetted increases, but the current density will remain constant. Fixing the wafer potential has the effect of fixing the current density and the overall current supplied. Using fixed wafer potential, the only effect of the time dependent wetting is a slight difference in total time of exposure to the electrolyte solution. Feature filling, which is strongly dependent on current density, is essentially uniform at all positions on the wafer surface.

Various process parameters have been investigated by the present inventors for the entry phase using a controlled voltage method. It has been determined that application of the following voltages to the wafer surface immediately upon first contact with the electrolyte solution provide good process performance.

EXAMPLE A

Application of a constant cathodic dc voltage having a value from about −5 mV (millivolts) to about −100 mV with respect to a reference electrode, for a duration of about 0 to about 5 seconds. For electroplating of copper, a copper metal reference electrode is preferred.

EXAMPLE B

Application of a pulsed, cathodic voltage having a value from about −10 mV to about −500 mV with respect to a reference electrode, having a waveform period from about 0.1 ms (milliseconds) to about 10 ms and a duty cycle from about 1% to about 50%, for a duration of about 0 to about 5 seconds.

2. The Initiation Phase.

The purpose of the initiation phase (phase 2) is to nucleate and grow a relatively thin film (less than approximately 300 Å) in a substantially conformal manner onto the recessed regions of the surface. The recessed surface regions typically have a poor quality metallic seed layer film (islands or spotty) following the entry phase. That is, even though the entry phase avoids or mitigates damage to the seed layer upon initial contact with the electrolyte solution, the seed layer is still typically inadequate to support sufficient current for the bottom-up filling of phase 3. During the initiation phase, metal is growing conformally thicker on the walls of the features and in the field region at the same rate. Such conformal growth actually decreases the active (current-carrying) surface area of the wafer within the features.

Thus, for a controlled-current mode of plating, the total current passing through the wafer is the same, but the surface area within the feature is decreasing and the local current density within the feature is increasing, which will cause the cell voltage to increase. This increase in current density may result in the features filling too quickly. As explained in the prior application, low current density leads to slow plating (as compared to the rate of diffusion of copper and additives to the surface) resulting in no preference for copper or suppression additives for either the top or bottom of recessed features, and hence, conformal plating. At higher current density, depletion of suppression additives preferentially at the bottom of recessed features results in bottom up filling which is desired at the following, third phase, but not at the initiation phase. Further, an increase in current density may have a deleterious effect because too rapid consumption of additives in the electrolyte bath might reduce the positive effect of enhanced film nucleation during the initiation phase of plating.

When a controlled-potential plating process is used, the current density is expected to remain relatively constant throughout the initiation phase of plating. (Note, however, that the thickness of the entire metallic field region, thus of the entire wafer, is increasing during the initiation phase, so that the voltage drop across the thicker field seed layer will be somewhat less than the corresponding voltage drop at the start of the initiation phase.)

Typical methods for the controlled-potential initiation phase to provide substantially conformal electroplating on the field region and on the recessed features of the surface are as follows:

EXAMPLE C

Apply a constant cathodic dc voltage from about −5 mV to about −100 mV with respect to a reference electrode. Application of the constant dc cathodic voltage is preferably carried out from approximately 0 to 30 seconds.

EXAMPLE D

Apply a pulsed cathodic voltage of from approximately −10 mV to approximately −1000 mV having a waveform period of about 0.1 to 10 ms and a duty cycle of approximately 1% to 50%. A background cathodic dc voltage of from about −5 mV to about −100 mV may be optionally superimposed on the pulsed cathodic voltage.

EXAMPLE E

Apply a ramped voltage starting at about −5 mV to about −100 mV and varying to about −100 mV to about −500 mV with a ramp speed of approximately −1 mV/sec to approximately −100 mV/sec (increasing the magnitude of the negative voltage, decreasing the voltage, at the rates indicated).

We note that the use of a proper shape and length of pulsed potential waveform during the initiation phase has the advantage of forcing most of the overall cell potential drop to occur between the wafer surface and the solution immediately adjacent to the surface. If the potential is stepped quickly to avoid "mass-transfer-control" effects, the current density is controlled by charge transfer both locally and globally across the wafer surface (see, for example, A. J. Bard and L. R. Faulkner, "Electrochemical Methods, Fundamentals and Applications," John Wiley and Sons, p. 141 (1980)). Mass-transfer-control as used above refers to an electroplating process in which the plating rate is controlled by the rate at which the plating cation migrates through the electrolyte solution and reaches the surface to be plated. Mass-transfer-control is undesirable because the bottom and sidewalls of high AR features would plate at substantially different rates. Thus, during the initiation phase a conformal deposition is expected to occur at every location within small features.

The present inventors have also observed that another means of improving conformal plating of the bottom and sidewalls of small features while simultaneously reducing the plating thickness at the upper part of the feature (effectively widening the feature towards its mouth) is to use a waveform having a low anodic dc voltage superimposed on the pulsed cathodic waveform. During the period of the waveform lacking a cathodic pulse, there is a constant lower dc voltage and lower-current anodic steady state. Thus, the dissolution of metal back into the plating bath is primarily governed by geometric effects whereby the top, sharp edges of the features are typically removed faster due to their greater exposure to solution. Additives in the plating bath will adsorb to different degrees over the surface of the features and tend to alter this geometric leveling. Thus, the magnitude of the anodic voltage (related to the anodic and cathodic current densities and the relative on and off times-duty cycle) will require adjustment for the type and amount of additives in the electrolyte solution.

3. The Bottom-Up Filling Phase.

It was shown in the prior application that at somewhat higher currents than those used in the initiation phase, the electrodeposition rate becomes sufficiently high that current-suppressing additives cannot be replenished within the diffusion-inaccessible feature as such additives are electroreduced or incorporated into the deposited layer. This destruction of current suppressers leads to acceleration of the electroplating rate within the features in comparison with the field region, that is the flat region on the wafer surface between features. Thus, there appears to be a certain minimum current density or filling rate that is required in order to establish the necessary degree of plating selectivity between the feature and the field. The plating selectivity, which may be termed "superfilling," is responsible for bottom-up filling.

As the pattern density, or number of features per unit area on the wafer, increases, the total current that must be supplied to the wafer to superfill the features must be increased. In addition, the necessary minimum local-current-density for superfilling also depends on the feature aspect ratio, width, and shape.

According to an aspect of the present invention, controlling the potential during electroplating provides an effective method of controlling the plating rate. Control of the potential can be more universally applicable, from wafer to wafer, where the wafers have different numbers of features, sizes of features, and distribution of features, than is control of the current. Controlled-potential electroplating achieves bottom-up filling, essentially independent of the number, size, and distribution of features on the wafer. The controlled-potential electroplating method for the bottom-up filling phase can use a constant, fixed potential. Alternatively, the controlled potential electroplating method uses a ramped potential in which the potential is increased with time. For a given desired potential time profile (fixed or ramped), the power supply driving the electroplating process is operated to compensate for any variation in feature density by adjusting the current to maintain the potential at the specified value.

It has also been shown that current-controlled pulse plating is effective in the bottom-up filling phase for removing "bottlenecked" structures that may occur. A reverse pulse of current reverses the plating process and removes metal from the surfaces. In particular, the reverse pulse is useful to remove material building up near the opening of features, leading to a bottleneck.

According to another aspect of the present invention, an increasing potential is combined with potential reversing to provide an effective bottom-up fill without bottlenecking. The reverse potential is applied for a time period sufficient to remove any bottlenecked structures in the upper periphery of the features, but insufficient to remove any appreciable amount of metal from the bottom of the features. Using any of the controlled-potential techniques, constant voltage, ramped voltage, or ramped voltage with potential reversing, the bottom-up filling phase is continued until all features initially having aspect ratios greater than about 0.5 are filled.

The precise adjustments of controlled-potential bottom-up filling will depend on the particular choice of additives and electrolyte bath conditions. However, the following examples have given satisfactory results in Shipley Ultrafill™ (Marlboro, Conn.) plating bath.

EXAMPLE F

A constant voltage from approximately −50 mV to approximately −750 mV with respect to a reference electrode is applied.

EXAMPLE G

An increasing voltage is used beginning at the final voltage of the initiation phase (phase 2) and ending at an increased (negative) voltage of about −100 mV to about −1000 mV. The precise values depend on wafer size, feature size and density.

EXAMPLE H

A pulsed cathodic voltage from approximately −100 mV to approximately −1000 mV, having a waveform period from about 0.1 ms to about 10 ms and a duty cycle from about 1% to about 50%, is applied.

EXAMPLE I

A pulsed voltage as in EXAMPLE H is superimposed over a background dc anodic voltage.

EXAMPLE J

Applying an ac voltage increasing in frequency from an initial frequency of about 1 Hz to a final frequency of about 100 kHz. This procedure allows the additives initially to adsorb more completely over the surfaces of the vias and trenches while later improving bottom-up filling by faster consumption of additives near the bottom of the features.

4. Low AR Filling Phase.

In addition to previously high AR features, very small AR features may occur on integrated circuits (e.g. "pads"). It is the function of the fourth phase to fill such features as well as to finish the filling of those features whose filling has begun in previous phases, if necessary. This generally is done by substantially conformal filling since the electroplating process is typically governed by electric field and diffusion dependent mechanisms during which additive depletion or side wall closure is not likely. Therefore, a layer of metal approximately equal to the dielectric layer in thickness is generally deposited (typically between 0.7 and 1.4 µm) to complete the electroplating process. As the fourth phase is generally the longest processing step, it is desirable to deposit metal uniformly using as high a current density as possible, for example, a current density of 25 mA/cm$^2$. This high current density can be achieved by maintaining a high constant voltage or a high constant current.

Having described the invention in detail, those skilled in the art will appreciate that, given the present disclosure, modifications may be made to the invention without departing from the spirit of the inventive concept described herein. Therefore, it is not intended that the scope of the invention be limited to the specific and preferred embodiments illustrated and described. Rather, it is intended that the scope of the invention be determined by the appended claims.

We claim:

1. An apparatus for an electrochemical process that comprises deposition of metal on a surface of a wafer and/or removal of at least a portion of metal on a surface of a wafer, the apparatus comprising:

at least one reference electrode in operable communication with a control circuit;

an electrode sufficient to serve as a counter electrode during the electrochemical process; and a holder sufficient for placing the wafer in an electrolyte, the holder comprising:

a power lead in operable communication with a power supply, the power lead comprising at least one power contact sufficient for contacting the surface of the wafer and communicating power to the surface of the wafer such that the surface of the wafer serves as a cathode or an anode during the electrochemical process; and at least one sense lead in operable communication with the control circuit, the sense lead comprising at least one sense contact, spatially separated from the power contact, sufficient for contacting the surface of the wafer, the sense lead not carrying appreciable current and being sufficient for sensing potential at at least one point on the surface of the wafer during the electrochemical process.

2. The apparatus of claim 1, wherein the electrolyte comprises ions of the metal and the reference electrode comprises an electrode in a capillary chamber that contains a solution comprising ions of the metal.

3. The apparatus of claim 1, further comprising at least one other sense lead sufficient for contacting the surface of the wafer at a location other than that at which the sense lead contacts the surface of the wafer.

4. The apparatus of claim 3, the holder comprising the at least one other sense lead.

5. The apparatus of claim 1, the at least one power contact sufficient for communicating controlled current to the surface of the wafer.

6. The apparatus of claim 1, the at least one power contact sufficient for communicating controlled potential to the surface of the wafer.

7. The apparatus of claim 1, the reference electrode not carrying appreciable current during the electrochemical process.

8. The apparatus of claim 1, the reference electrode sufficient for measuring potential of the electrolyte relative to the potential at at least one point on the surface of the wafer during the electrochemical process.

* * * * *